United States Patent
Kuhn et al.

(10) Patent No.: US 10,655,014 B2
(45) Date of Patent: *May 19, 2020

(54) SILOXANE RESIN COMPOSITIONS

(71) Applicant: Wacker Chemie AG, Munich (DE)

(72) Inventors: Arvid Kuhn, Burghausen (DE);
Young-Hyuk Joo, Suwon-si (KR);
Frank Sandmeyer, Burgkirchen (DE);
Hyun-Kwan Yang, Yongin-si (KR)

(73) Assignee: WACKER CHEMIE AG, Munich (DE)

( * ) Notice: Subject to any disclaimer, the term of this patent is extended or adjusted under 35 U.S.C. 154(b) by 59 days.

This patent is subject to a terminal disclaimer.

(21) Appl. No.: 16/063,411

(22) PCT Filed: Dec. 7, 2016

(86) PCT No.: PCT/EP2016/080087
§ 371 (c)(1),
(2) Date: Jun. 18, 2018

(87) PCT Pub. No.: WO2017/102502
PCT Pub. Date: Jun. 22, 2017

(65) Prior Publication Data
US 2018/0371246 A1      Dec. 27, 2018

(30) Foreign Application Priority Data

Dec. 18, 2015  (DE) .................. 10 2015 225 921

(51) Int. Cl.
| | | |
|---|---|---|
| *C08L 83/04* | (2006.01) | |
| *C08K 5/56* | (2006.01) | |
| *C08L 83/00* | (2006.01) | |
| *C08K 3/013* | (2018.01) | |
| *C08K 5/00* | (2006.01) | |
| C08G 77/12 | (2006.01) | |
| C08G 77/20 | (2006.01) | |
| C08G 77/00 | (2006.01) | |
| C08G 77/18 | (2006.01) | |
| H01L 23/29 | (2006.01) | |
| H01L 33/56 | (2010.01) | |

(52) U.S. Cl.
CPC .............. *C08L 83/04* (2013.01); *C08K 3/013* (2018.01); *C08K 5/0016* (2013.01); *C08K 5/56* (2013.01); *C08L 83/00* (2013.01); *C08G 77/12* (2013.01); *C08G 77/18* (2013.01); *C08G 77/20* (2013.01); *C08G 77/80* (2013.01); *C08L 2203/206* (2013.01); *H01L 23/296* (2013.01); *H01L 33/56* (2013.01)

(58) Field of Classification Search
CPC ......... C08G 77/12; C08G 77/20; C08G 77/80
USPC ............................................... 528/31, 32, 43
See application file for complete search history.

(56) References Cited

U.S. PATENT DOCUMENTS

| | | | |
|---|---|---|---|
| 5,162,480 A * | 11/1992 | Schilling, Jr. .......... | C08G 77/08 528/23 |
| 5,753,751 A * | 5/1998 | Liao ....................... | C08G 77/08 524/837 |
| 7,527,871 B2 | 5/2009 | Morita et al. | |
| 7,666,969 B2 | 2/2010 | Loessel et al. | |
| 2012/0172544 A1 | 7/2012 | Liang et al. | |
| 2013/0150535 A1* | 6/2013 | Griswold ................ | C08L 83/00 525/477 |
| 2013/0217930 A1* | 8/2013 | Haensel .................. | C10B 57/06 585/3 |
| 2016/0194452 A1 | 7/2016 | Sandmeyer et al. | |

FOREIGN PATENT DOCUMENTS

| | | |
|---|---|---|
| EP | 2581954 A1 | 4/2013 |
| EP | 2586832 A1 | 5/2013 |
| EP | 2730620 A1 | 5/2014 |
| JP | 2012188627 A | 10/2012 |
| JP | 2012193235 A | 10/2012 |
| TW | 201226475 A | 7/2012 |
| WO | 2011155482 A1 | 12/2011 |
| WO | 2011162294 A1 | 12/2011 |
| WO | 2015014890 A1 | 2/2015 |

* cited by examiner

*Primary Examiner* — Marc S Zimmer
(74) *Attorney, Agent, or Firm* — Brooks Kushman P.C.

(57) ABSTRACT

Addition curable silicone resin compositions have excellent processing characteristics, and can be used to encapsulate electrical and electronic devices.

14 Claims, No Drawings

SILOXANE RESIN COMPOSITIONS

CROSS REFERENCE TO RELATED APPLICATIONS

This application is the U.S. National Phase of PCT Appln. No. PCT/EP2016/080087 filed Dec. 7, 2016, which claims priority to German Application No. 10 2015 225 921.8 filed Dec. 18, 2015, the disclosures of which are incorporated in their entirety by reference herein.

BACKGROUND OF THE INVENTION

1. Field of the Invention

The invention relates to siloxane resin compositions, to processes for production thereof and also to the use thereof in the manufacture of electrically isolating shaped articles and optical semiconductor elements.

2. Description of the Related Art

Binders and preparations to be used in the manufacture of electrically isolating component parts have to meet extensive and demanding requirements, including for example:
good surface hardness;
coupled with flexibility;
good lightfastness;
good weathering resistance;
good thermal stability;
low gas transmission and thus avoidance of corrosion;
high transparency;
high refractive index;
no yellowing (discoloration due to heat);
good technical properties in processing, for example good shaping properties, rapid and controllable cure to the shaped article, robust, error-tolerant processing properties, process-adapted viscosity; and
cost efficiency;
although not all these properties have to be equally highly developed in every application.

There have already been many prior art proposals. WO-A 15014890 and U.S. Pat. No. 7,527,871 may be referenced by way of example.

The use of addition-crosslinking silicone compositions for the production of LEDs is already known. They are oftentimes multicomponent systems consisting of at least one organopolysiloxane having at least two aliphatically unsaturated groups in the molecule and at least one organohydropolysiloxane having two or more Si—H groups in the molecule and also at least one hydrosilylation catalyst and usually further formulation components. In the majority of preparations, the two complementary Si—H and Si-vinyl functions required for the hydrosilylation reaction are shared between various polyorganosiloxanes in the preparation.

SUMMARY OF THE INVENTION

The invention provides compositions containing
(A) organopolysiloxanes formed of at least 3 units of the formula

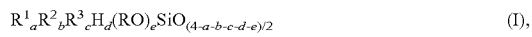

$$R^1_a R^2_b R^3_c H_d (RO)_e SiO_{(4-a-b-c-d-e)/2} \quad (I),$$

where
$R^1$ represents monovalent, SiC-bonded, optionally halogen- or cyano-substituted, hydrocarbyl moieties with aliphatic carbon-carbon multiple bonding and may be the same or different at each occurrence,
$R^2$ represents monovalent, SiC-bonded, optionally halogen- or cyano-substituted, saturated hydrocarbyl moieties and may be the same or different at each occurrence,
$R^3$ represents identical or different monovalent SiC-bonded aromatic moieties,
R represents a hydrogen atom or monovalent, optionally substituted hydrocarbyl moieties, which may be interrupted by heteroatoms, and may be the same or different at each occurrence,
a is 0, 1, 2 or 3, preferably 0 or 1,
b is 0, 1, 2 or 3, preferably 0 or 2,
c is 0, 1, 2 or 3, preferably 0 or 1,
d is 0, 1 or 2, preferably 0 or 1, and
e is 0, 1 or 2, preferably 0 or 1, in particular 0,
with the proviso that the a+b+c+d+e sum is not more than 3, the sum total of Si-bonded hydrogen atoms and $R^1$ moieties per molecule is at least 3, the a+b+c+d sum is equal to 0 or 1 in at least 10 mol % of the units of formula (I), and c is other than 0 in at least one unit,
optionally (B) organopolysiloxanes formed of units of the formula

$$R^4_f R^5_g R^6_h (R^7 O)_i SiO_{(4-f-g-h-i)/2} \quad (VI)$$

where
$R^4$ represents monovalent, SiC-bonded, optionally halogen- or cyano-substituted, hydrocarbyl moieties with aliphatic carbon-carbon multiple bonding and may be the same or different at each occurrence,
$R^5$ represents monovalent, SiC-bonded, optionally halogen- or cyano-substituted, saturated hydrocarbyl moieties and may be the same or different at each occurrence,
$R^6$ represents identical or different monovalent SiC-bonded aromatic moieties,
$R^7$ represents a hydrogen atom or monovalent, optionally substituted hydrocarbyl moieties, which may be interrupted by heteroatoms, and may be the same or different at each occurrence,
f is 0, 1, 2 or 3, preferably 0 or 1,
g is 0, 1, 2 or 3, preferably 1 or 2,
h is 0, 1 or 2, preferably 0 or 1, and
i is 0 or 1, preferably 0,
with the proviso that the f+g+h+i sum is not more than 3, siloxanes (B) have at least two $R^4$ moieties per molecule, the f+g+h+i sum is equal to 0 or 1 in not more than 20 mol % of the units of formula (VI) and h is other than 0 in at least one unit of formula (VI),
(C) organopolysiloxanes formed of units of the formula

$$R^8_k R^9_l R^{10}_m (R^{11}O)_n SiO_{(4-k-l-m-n)/2} \quad (X),$$

where
$R^8$ represents monovalent, SiC-bonded, optionally halogen- or cyano-substituted, hydrocarbyl moieties with aliphatic carbon-carbon multiple bonding and may be the same or different at each occurrence,
$R^9$ represents monovalent, SiC-bonded, optionally halogen- or cyano-substituted, saturated hydrocarbyl moieties and may be the same or different at each occurrence,
$R^{10}$ represents identical or different monovalent SiC-bonded aromatic moieties,
$R^{11}$ represents a hydrogen atom or monovalent, optionally substituted hydrocarbyl moieties, which may be interrupted by heteroatoms, and may be the same or different at each occurrence,
k is 0, 1, 2 or 3, preferably 0 or 1,
l is 0, 1, 2 or 3, preferably 0, 1 or 2, m is 0, 1 or 2, preferably 0 or 1, and n is 0 or 1, preferably 0, with the proviso that the k+l+m+n sum is not more than 3, siloxanes (C) have at least two $R^8$ moieties per molecule, the k+l+m+n sum is equal to 0 or 1 in at least 10 mol % of the units of formula (X) and m is other than 0 in at least one unit of formula (X), and also optionally (D) a catalyst to promote the addition of Si-bonded hydrogen onto aliphatic carbon-carbon multiple bonds.

Preferably, in the siloxanes (A), not only Si-bonded hydrogen atoms but also $R^1$ moieties are overwhelmingly, preferably exclusively, bonded to silicon atoms of units of formula (I) where the a+b+c+d+e sum equals 3. More preferably, in the siloxanes (A), not only Si-bonded hydrogen atoms but also $R^1$ moieties are overwhelmingly, preferably exclusively, bonded to silicon atoms of units of formula (I) where the a+b+c+d sum equals 3, i.e. to so-called M units, bearing no (OR) groups. These terminal functionalities in siloxane (A) ensure their ready accessibility and availability for chemical reactions with a complementarily functionalized reactant entity. This yields the surprising advantage that merely a minimum of functional groups is needed in order to arrive at a solid cured body.

The (A) siloxanes employed according to the invention contain units of formula (I) where a+b+c+d is 0 or 1 in amounts of preferably at least 20 mol %, more preferably at least 25 mol %, yet more preferably at least 30 mol %, and most preferably 35 to 70 mol %. Since units of formula (I) where a+b+c+d is 0 can, depending on the profile of requirements, easily lead to some usually undesired embrittlement, units of formula (I) where a+b+c+d is 1 are preferable as branching units.

The (A) siloxanes employed according to the invention preferably do not contain any units of formula (I) where a+b+c+d=0.

Units of formula (I) where a+b+c+d is 2 may be used inter alia to establish the mechanical properties, since they plasticize and flexibilize. The (A) siloxanes employed according to the invention preferably contain not more than 25 mol % of units of formula (I) where a+b+c+d=2, preferably not more than 5 mol %, more preferably not more than 2 mol %, most preferably none.

Preferably, the $R^1$, $R^4$ and $R^8$ moieties each comprise, independently of each other, hydrocarbyl moieties having aliphatic multiple bonding and from 2 to 8 carbon atoms, such as vinyl, allyl, methallyl, 2-propenyl, 3-butenyl, 4-pentenyl, 5-hexenyl, 1,3-butadienyl, hexadienyl, cyclopentenyl, cyclopentadienyl, cyclohexenyl, ethynyl, propargyl, 2-propynyl and isoprenyl, of which vinyl and allyl are particularly preferable, most preferably vinyl.

Examples of $R^2$, $R^5$ and $R^9$ moieties are, independently of each other, alkyl moieties such as methyl, ethyl, n-propyl, isopropyl, n-butyl, isobutyl, tert-butyl, n-pentyl, isopentyl, neopentyl, and tert-pentyl, hexyl such as n-hexyl, heptyl such as n-heptyl, octyl such as n-octyl and isooctyl such as 2,2,4-trimethylpentyl, nonyl such as n-nonyl, decyl such as n-decyl, dodecyl such as n-dodecyl, and octadecyl such as n-octadecyl, and cycloalkyl such as cyclopentyl, cyclohexyl, cycloheptyl or methylcyclohexyl.

Preferably, the $R^2$, $R^5$ and $R^9$ moieties independently of each other comprise saturated hydrocarbyl moieties having from 1 to 12 carbon atoms, more preferably saturated hydrocarbyl moieties having from 1 to 4 carbon atoms, most preferably methyl.

Examples of $R^3$, $R^6$ and $R^{10}$ moieties are, independently of each other, aryl such as phenyl, naphthyl, anthryl or phenanthryl, indenyl, benzophenyl, fluorenyl, xanthenyl and anthronyl; aryloxyaryl moieties such as o-phenoxyphenyl and p-phenoxyphenyl; alkaryl moieties such as o-, m-, p-tolyl moieties, xylyl moieties and ethylphenyl moieties; and aralkyl moieties such as benzyl, α-phenylethyl and β-phenylethyl.

Preferably, the $R^3$, $R^6$ and $R^{10}$ moieties comprise, independently of each, other aryl moieties such as phenyl or naphthyl, more preferably phenyl.

Examples of R, $R^7$ and $R^{11}$ moieties are the moieties indicated for $R^2$ and $R^3$.

More preferably, the R, $R^7$ and $R^{11}$ moieties are hydrogen, methyl or ethyl, yet more preferably hydrogen.

Component (A) preferably comprises siloxanes having at least 3 units selected from those of the formulae $R^1{}_a R^2{}_b R^3{}_c H_d (RO)_e SiO_{1/2}$ where $(a+b+c+d+e)=3$ (II), $R^2{}_b R^3{}_c (RO) SiO_{2/2}$ where $(b+c)=1$ (IIIa), $R^2{}_b R^3{}_c SiO_{2/2}$ where $(b+c)=2$ (IIIb), $R^2{}_b R^3{}_c (RO)_e SiO_{3/2}$ where $(b+c+e)=1$ (IV), and $SiO_{4/2}$ (V), where R, $R^1$, $R^2$, $R^3$, a, b, c, d and e are each as defined above, with the proviso that not more than 25 mol %, more preferably not more than 5 mol %, of the units in siloxanes (A) conform to formula (IIIb), the sum total of Si-bonded hydrogen atoms and $R^1$ moieties per molecule is at least 3, at least one $R^3$ moiety is present per molecule and at least one unit of formula (IV) and/or (V) is present.

The (A) siloxanes preferably consist of 3 to 1000, more preferably 3 to 150, and most preferably 3 to 50 units of formula (I).

The (A) siloxanes preferably contain at least 5 mol % of units of formula (II), at least 30 mol % of units of formula (IV), at most 25 mol % of units of formula (IIIb) and at most 20 mol % of units of formula (V).

More preferably, component (A) comprises siloxanes consisting of at least one unit selected from $R^2{}_3 SiO_{1/2}$, $R^1 R^2{}_2 SiO_{1/2}$, $R^2{}_2 H SiO_{1/2}$, $R^2{}_2 R^3 SiO_{1/2}$, $R^2 R^3{}_2 SiO_{1/2}$, $R^1 R^2 R^3 SiO_{1/2}$ and $R^2 R^3 H SiO_{1/2}$ units and also at least one unit selected from $R^3 SiO_{3/2}$, $ROSiO_{3/2}$ and $R^2 SiO_{3/2}$ units and also optionally units (IIIb) selected from $R^2{}_2 SiO_{2/2}$, $R^2 R^3 SiO_{2/2}$ and $R^3{}_2 SiO_{2/2}$ units and also optionally $R^2$ (RO) $SiO_{2/2}$ and $R^3$ (RO) $SiO_{2/2}$ units, where R, $R^1$, $R^2$ and $R^3$ are each as defined above, with the proviso that the siloxanes (A) have at least 3 siloxy units, the sum total of Si-bonded hydrogen atoms and $R^1$ moieties per molecule is at least 3 and at least one $R^3$ moiety is present per molecule and at most 25 mol % of units of formula (IIIb) are present.

Preferred examples of component (A) are siloxanes consisting of at least one unit selected from $Me_3 SiO_{1/2}$, $ViMe_2 SiO_{1/2}$, $Me_2 HSiO_{1/2}$, $Me_2 PhSiO_{1/2}$, $MePh_2 SiO_{1/2}$, $ViMePhSiO_{1/2}$ and $MePhHSiO_{1/2}$ units and also at least one unit selected from $PhSiO_{3/2}$, $HOSiO_{3/2}$, $Ph(HO)SiO_{2/2}$, and $MeSiO_{3/2}$ units where Me is methyl, Vi is vinyl and Ph is phenyl, with the proviso that the siloxanes (A) consist of 3 to 50 siloxy units, the sum total of Si-bonded hydrogen atoms and vinyl moieties per molecule is at least 3 and at least one phenyl moiety is present per molecule.

The (A) siloxanes used according to the invention preferably have no (OR) moieties. When, however, they do have (OR) moieties, for example as a consequence of the method of synthesis, the amounts are preferably ≤5 wt %, more preferably ≤5000 weight ppm, most preferably ≤1000 weight ppm.

The molar fraction of Si-bonded hydrogen atoms as a proportion of the total number of Si-bonded moieties in siloxane (A) is preferably from 0.1 to 50%, more preferably from 2 to 40%, most preferably from 5 to 30%. Determination is preferably by $^{29}$Si NMR spectroscopy.

The molar fraction of $R^1$ moieties as a proportion of the total number of Si-bonded moieties in siloxane (A) is preferably from 1 to 50%, more preferably from 1 to 40%, and most preferably from 5 to 30%. Determination is preferably by $^{29}$Si NMR spectroscopy.

The ratio of Si-bonded hydrogen atoms to Si-bonded $R^1$ moieties in the (A) siloxane employed according to the invention is preferably from 0.1 to 9, more preferably from 0.8 to 7, yet more preferably from 0.9 to 5, and most preferably from 1.0 to 2.5.

The molar fraction of silicon atoms bearing at least one aromatic moiety $R^3$ as a proportion of the total number of silicon atoms in siloxane (A) is preferably at least 30%, more preferably from 40% to 75%, and most preferably from 45% to 60%.

Siloxanes (A) preferably have an average molecular weight Mw of preferably at least 600 g/mol, more preferably at least 700 g/mol, yet more preferably at least 800 g/mol, and most preferably between 900 and 5000 g/mol, while the polydispersity is preferably at most 20, more preferably at most 15, yet more preferably at most 10, and most preferably at most 6, measured using SEC with THF as the mobile phase, a concentration of 5 mg/ml, and using an RI detector, against polystyrene as a standard.

The (A) siloxane resins employed according to the invention may either solid or liquid at 23° C. and 1000 hPa. Siloxanes (A) are preferably liquid.

The viscosity of siloxanes (A) employed according to the invention is preferably between 10 and 20,000 mPas, more preferably between 20 and 15,000 mPas, yet more preferably between 30 and 10,000 mPas, most preferably between 40 and 8000 mPas.

In a further embodiment, siloxanes (A) are materials at 23° C. and a pressure of 1013 hPa that are firm, i.e. no longer flowable, while still having a tacky surface, or they are non-tacky solids having a glass transition temperature of more than 25° C.

The (A) siloxane resins employed according to the invention are already known and are obtainable by different methods known to those skilled in the art, for example by reaction of chlorosilanes with water. U.S. Pat. No. 7,666,969 may be referenced by way of example.

The siloxanes (A) can be used not only in pure form but also in the form of a mixture with a suitable solvent. Use in pure form is preferred. When a solvent is used, the selection depends on the particular organic functional group in component (A). It is advantageous to choose solvents that are not reactive with component (A). Examples of suitable solvents are aromatic solvents, such as toluene, xylene, ethylbenzene or mixtures thereof, and also hydrocarbons and/or mixtures thereof such as, for example, commercially available isoparaffin mixtures and others.

Preferably, in the (B) siloxanes optionally used, the $R^4$ moieties are overwhelmingly, preferably exclusively, bonded to silicon atoms of units of formula (VI) where the f+g+h sum equals 3.

Preferably, component (B) comprises siloxanes consisting of units selected from those of the formulae $R^4_f R^5_g R^6_h (R^7O)_i SiO_{1/2}$ where $(f+g+h+i)=3$ (VII), $R^5_g R^6_h (R^7O) SiO_{2/2}$ where $(g+h)=1$ (VIIIa), $R^5_g R^6_h SiO_{2/2}$ where $(g+h)=2$ (VIIIb), $R^5_g R^6_h (R^7O)_i SiO_{3/2}$ where $(g+h+i)=1$ (IX) and $SiO_{4/2}$ (V), where $R^4$, $R^5$, $R^6$, $R^7$, f, g, h and i are each as defined above, with the proviso that siloxanes (B) have at least two $R^4$ moieties per molecule, not more than 20 mol % of the units conform to formula (IX) or (V) and at least one $R^6$ moiety is present per molecule.

The (B) siloxanes optionally employed according to the invention preferably contain at least 30 mol % of units of the formula (VIIIb).

More preferably, component (B) comprises siloxanes consisting of at least two units selected from $R^4 R^5_2 SiO_{1/2}$, $R^4 R^5 R^6 SiO_{1/2}$ and $R^4 R^6_2 SiO_{1/2}$ units and also at least one unit selected from $R^5_2 SiO_{2/2}$, $R^5 R^6 SiO_{2/2}$ and $R^6_2 SiO_{2/2}$ units, where $R^4$, $R^5$ and $R^6$ are each as defined above.

The (B) siloxanes optionally employed according to the invention preferably consist of 3 to 1000 siloxy units, more preferably of 4 to 500 units, most preferably of 8 to 100 units.

The (B) siloxanes optionally employed according to the invention most preferably comprise linear organopolysiloxanes of the structure $(R^4 R^5_2 SiO_{1/2})(R^6 R^5 SiO)_{1-100}(R^5_2 SiO)_{0-70}$
$(R^4 R^5_2 SiO_{1/2})$, where $R^4$, $R^5$ and $R^6$ are each as defined above and the $(R^6 R^5 SiO)$ units and $(R^5_2 SiO)$ units may have a random distribution in the molecule.

Examples of (B) siloxanes optionally employed according to the invention are $(Me_2 ViSiO_{1/2})$ 2 $(MePhSiO_{2/2})$ 60 $(Me_2 SiO_{2/2})$ 12/$(Me_2 ViSiO_{1/2})$ 2 $(MePhSiO_{2/2})$ 10 $(Me_2 SiO_{2/2})$ 2, $(Me_2 ViSiO_{1/2})$ 2 $(MePhSiO_{2/2})$ and $(Me_2 ViSiO_{1/2})$ 2 $(Ph_2 SiO_{2/2})$ where Me is methyl, Vi is vinyl and Ph is phenyl.

The (B) siloxanes optionally employed according to the invention preferably have viscosities at 25° C. of preferably 10 to 100,000 mPas, more preferably 100 to 20,000 mPas.

When the compositions of the invention contain component (B), the amounts are preferably from 1 to 200 parts by weight, more preferably from 10 to 150 parts by weight and most preferably from 20 to 120 parts by weight, all based on 100 parts by weight of component (A). In a preferred embodiment, the compositions of the invention contain no component (B).

The (B) siloxanes optionally employed according to the invention are commercially available products and/or obtainable by chemically routine methods.

The (C) siloxanes employed according to the invention preferably have their $R^8$ moieties bonded overwhelmingly, preferably exclusively, to silicon atoms of units of formula (X) where the k+l+m sum equals 3.

Component (C) preferably comprises siloxanes consisting of units selected from those of the formulae $R^8_k R^9_l R^{10}_m (R^{11}O)_n SiO_{1/2}$ where $(k+l+m+n)=3$ (XI), $R^9_l R^{10}_m (R^{11}O) SiO_{2/2}$ where $(l+m)=1$ (XIIa), $R^9_l R^{10}_m SiO_{2/2}$ where $(l+m)=2$ (XIIb), $R^9{}_l R^{10}{}_m (R^{11}O)_n SiO_{3/2}$ where $(l+m+n)=1$ (XIII) and $SiO_{4/2}$ (V)

where $R^8$, $R^9$, $R^{10}$, $R^{11}$, k, l, m and n are each as defined above, with the proviso that siloxanes (C) have at least two $R^8$ moieties per molecule, at least one $R^{10}$ moiety is present per molecule and at least one unit of formula (XIII) and/or (V) is present.

The (C) siloxanes employed according to the invention preferably contain at least 5 mol % of units of formula (XI), at least 30 mol % of units of formula (XIII) and at most 20 mol % of units of formula (V).

Component (C) more preferably comprises siloxanes consisting of at least one unit selected from $R^9{}_3SiO_{1/2}$, $R^8R^9{}_2SiO_{1/2}$, $R^9{}_2R^{10}SiO_{1/2}$, $R^9R^{10}{}_2SiO_{1/2}$, $R^8R^9R^{10}SiO_{1/2}$ and $R^8R^{10}{}_2SiO_{1/2}$ units and also at least one unit selected from $R^{10}SiO_{3/2}$, $(R^{11}O)SiO_{3/2}$ and $R^9SiO_{3/2}$ units, and also optionally units selected from $R^9{}_2SiO_{2/2}$, $R^9R^{10}SiO_{2/2}$, $R^{10}{}_2SiO_{2/2}$, $R^9{}_2(R^{11}O)SiO_{1/2}$, $R^9R^{10}(R^{11}O)SiO_{1/2}$, $R^9(R^{11}O)SiO_{2/2}$ and $R^{10}(R^{11}O)SiO_{2/2}$ units, where $R^8$, $R^9$, $R^{10}$ and $R^{11}$ are each as defined above, with the proviso that at least two $R^8$ moieties and also at least one $R^{10}$ moiety are present per molecule and the optionally contained units $R^9{}_2SiO_{2/2}$, $R^9R^{10}SiO_{2/2}$ and $R^{10}{}_2SiO_{2/2}$ may be present in component (C) blockwise, as well as in a random distribution.

The (C) resins employed according to the invention preferably have no $(OR^{11})$ moieties. When, however, they do have $(OR^{11})$ moieties, for example as a consequence of the method of synthesis, the amounts are preferably ≤5 wt %, more preferably ≤5000 weight ppm, specifically ≤1000 weight ppm.

The molar fraction of $R^8$ moieties as a proportion of the total number of Si-bonded moieties in siloxane (C) is preferably from 0.1 to 50%, more preferably from 0.1 to 40%, and most preferably from 1 to 30%. Determination is preferably by $^{29}Si$ NMR spectroscopy.

The molar fraction of silicon atoms bearing at least one aromatic moiety $R^{10}$ as a proportion of the total number of silicon atoms in siloxane (C) is preferably at least 30%, more preferably from 40% to 80%, and most preferably from 50% to 75%.

The (C) siloxanes employed according to the invention preferably consist of 3 to 1000 siloxy units, more preferably of 8 to 500 units, most preferably of 8 to 100 units.

Preferred examples of component (C) are siloxanes consisting of at least one unit selected from $Me_3SiO_{1/2}$, $ViMe_2SiO_{1/2}$, $Me_2PhSiO_{1/2}$, $MePh_2SiO_{1/2}$ and $ViMePhSiO_{1/2}$ units and also at least one unit selected from $PhSiO_{3/2}$, $HOSiO_{3/2}$ and $MeSiO_{3/2}$ units and also optionally units selected from $Me_2SiO_{2/2}$, $MePhSiO_{2/2}$, $Ph_2SiO_{2/2}$, $Me_2(Me_O)SiO_{1/2}$, $Me_2(EtO)SiO_{1/2}$, $Me_2(HO)SiO_{1/2}$, $MePh(Me_O)SiO_{1/2}$, $MePh(EtO)SiO_{1/2}$, $MePh(HO)SiO_{1/2}$, $Ph(Me_O)SiO_{2/2}$, $Ph(EtO)SiO_{2/2}$ and $Ph(HO)SiO_{2/2}$ units where Me is methyl, Et is ethyl, Vi is vinyl and Ph is phenyl, with the proviso that at least 2 vinyl moieties and at least one phenyl moiety are present per molecule and the optionally contained units $R^9{}_2SiO_{2/2}$, $R^9R^{10}SiO_{2/2}$ and $R^{10}{}_2SiO_{2/2}$ may be present in component (C) blockwise as well as in a random distribution.

Siloxanes (C) preferably have an average molecular weight Mw of preferably at least 600 g/mol, more preferably at least 700 g/mol, yet more preferably at least 800 g/mol, most preferably between 900 and 10,000 g/mol, while the polydispersity is preferably at most 20, more preferably at most 15, yet more preferably at most 10, and most preferably at most 8.

The (C) siloxane resins employed according to the invention may be solid or liquid at 23° C. and 1000 hPa, and when liquid, the viscosity of the liquid siloxane resins (C) may be in the range from low to high. The siloxanes (C) are preferably of low viscosity.

When the (C) siloxane resins employed according to the invention are of low viscosity, the viscosity is preferably between 10 and 20,000 mPas, more preferably between 20 and 15,000 mPas, yet more preferably between 30 and 10,000 mPas and most preferably between 40 and 8000 mPas, all at 25° C.

In a likewise preferred embodiment, siloxanes (C) are materials which at 23° C. are highly viscous to firm and have a still tacky surface and glass transition temperatures of more than −20° C., or are non-tacky solids having a glass transition temperature of more than 25° C.

The compositions of the invention preferably contain components (C) in amounts of from 1 to 200 parts by weight, more preferably from 10 to 150 parts by weight, and most preferably from 20 to 100 parts by weight, all based on 100 parts by weight of component (A).

The (C) siloxanes employed according to the invention are obtainable by chemically routine methods.

Component (D), which promotes the addition of Si-bonded hydrogen onto aliphatic carbon-carbon multiple bonding (hydrosilylation), in the compositions of the invention may be any hydrosilylation catalyst.

Examples of component (D) are metallic and finely divided platinum, which may be supported on carriers such as silicon dioxide, aluminium oxide or activated carbon, compounds or complexes of platinum, such as platinum halides, e.g. $PtCl_4$, $H_2PtCl_6 \cdot 6H_2O$, $Na_2PtCl_4 \cdot 4H_2O$, platinum-olefin complexes, platinum-alcohol complexes, platinum-alkoxide complexes, platinum-ether complexes, platinum-aldehyde complexes, platinum-ketone complexes, including reaction products formed from $H_2PtCl_6 \cdot 6H_2O$ and cyclohexanone, platinum-vinylsiloxane complexes, specifically platinum-divinyltetramethyldisiloxane complexes with or without presence of detectable inorganically bound halogen, bis(gamma-picoline)platinum dichloride, trimethylenedipyridineplatinum dichloride, dicyclopentadieneplatinum dichloride, dimethylsulphoxideethyleneplatinum(II) dichloride and also reaction products of platinum tetrachloride with olefin and with primary amine or secondary amine or with primary and secondary amine, such as the reaction product formed from 1-octene-dissolved platinum tetrachloride with sec-butylamine, or ammonium-platinum complexes, rhodium, palladium, ruthenium and iridium and also their compounds and complexes. Photocurable or UV-curable compositions may utilize, for example, alkylplatinum complexes such as derivatives of cyclopentadienyltrimethylplatinum(IV), cyclooctadienyldimethylplatinum(II) or diketonato complexes such as bisacetylacetonatoplatinum (II) in order to start the addition reaction with the aid of light.

These compounds may be encapsulated in a resin matrix.

The (D) catalyst optionally employed according to the invention preferably utilizes platinum, its compounds or complexes, more preferably platinum-divinyltetramethyldisiloxane complexes.

In another preferred embodiment of the invention, the (D) catalyst optionally employed is selected from the group consisting of cyclopentadienyltrimethylplatinum(IV) and derivatives thereof.

When catalyst (D) is employed, the amount is determined according to the desired rate of crosslinking and the particular use and also economic considerations. The compositions of the invention do preferably contain catalyst (D).

The compositions of the invention preferably contain catalysts (D) in amounts resulting in a platinum content of from 0.05 to 500 weight ppm (=parts by weight per million parts by weight), more preferably from 0.5 to 100 weight ppm, most preferably from 1 to 50 weight ppm, all based on the total weight of the crosslinkable composition.

In addition to the employed components (A), (B), optionally (C) and optionally (D), the compositions of the invention may contain any further chemical entities also used hitherto in materials crosslinkable by addition reaction other than components (A), (B), (C) and (D), examples being fillers (E), adhesion promoters (F), inhibitors (G), plasticizers (H), additives (K) and organic solvents (L).

The (E) fillers optionally employed in the compositions of the invention may comprise any prior art fillers.

Examples of fillers (E) are nonreinforcing fillers, i.e. fillers preferably having a BET surface area of up to 50 $m^2/g$, such as quartz, diatomaceous earth, calcium silicate, zirconium silicate, talc, kaolin, zeolites, metal oxide powders, such as oxides of aluminium, of titanium, of iron or of zinc, and/or mixed oxides thereof, barium sulphate, calcium carbonate, gypsum, silicon nitride, silicon carbide, boron nitride, glass powder and pulverulent plastic, such as polyacrylonitrile powder; reinforcing fillers, i.e. fillers having a BET surface area of more than 50 $m^2/g$, such as fumed silica, precipitated silica, precipitated chalk, carbon black such as furnace and acetylene blacks and silicon-aluminium mixed oxides of large BET surface area; aluminium trihydroxide, fillers in the form of hollow beads such as ceramic microbeads, elastic polymeric beads, or glass beads, or fibrous fillers. The recited fillers may be in a hydrophobicized state, for example due to treatment with organosilanes/organosiloxanes or with stearic acid or etherification of hydroxyl groups into alkoxy groups.

The (E) fillers optionally employed preferably comprise reinforcing fillers having a BET surface area of more than 50 $m^2/g$, such as fumed silica.

Optionally employed fillers (E) preferably have a moisture content of preferably below 1 wt %, more preferably below 0.5 wt %.

When the compositions of the invention do contain fillers (E), the amounts are preferably from 1 to 40 parts by weight, more preferably from 5 to 35 parts by weight and most preferably from 10 to 30 parts by weight, all based on 100 parts by weight of ingredient (A).

In a further embodiment of the invention, the compositions contain from 0.01 to 3.0 parts by weight, preferably from 0.05 to 1.0 part by weight, of a fumed silica having a surface area of more than 50 $m^2/g$ for the purpose of controlling the rheological properties.

The compositions of the invention preferably contain no fillers (E).

The (F) adhesion promoters optionally employed in the compositions of the invention may comprise any prior art adhesion promoters.

Examples of adhesion promoters (F) are silanes or siloxanes having methacryloyloxy or epoxy functions, of which silanes or siloxanes having epoxy functions are preferable.

When the compositions of the invention contain adhesion promoters (F), the amounts are preferably from 0.01 to 10 parts by weight, more preferably from 0.05 to 5 parts by weight and most preferably from 0.1 to 3 parts by weight, all based on 100 parts by weight of ingredient (A). The compositions of the invention preferably do contain adhesion promoters (F).

The (G) inhibitors optionally employed may comprise any stabilizers and inhibitors known from the field of addition-crosslinking compositions and used to precision engineer the pot life and crosslinking rate for the crosslinkable compositions. Examples of customary inhibitors are acetylenically unsaturated alcohols such as 3-methyl-1-butyn-3-ol, 1-ethynylcyclohexan-1-ol, 3,5-dimethyl-1-hexyn-3-ol and 3-methyl-1-pentyn-3-ol, polymethylvinylcyclosiloxanes such as 1,3,5,7-tetramethyl-1,3,5,7-tetravinylcyclotetrasiloxane, linear vinylsiloxanes such as 1,1,3,3-tetramethyl-1,3-divinyldisiloxane and (vinyl-methyl)-siloxy-dimethyl-siloxy copolymers, trialkyl cyanurates, alkyl maleates such as diallyl maleate and dimethyl maleate, alkyl fumarates such as diethyl fumarate and diallyl fumarate, β-keto compounds such as acetylacetonate, organic hydroperoxides such as cumene hydroperoxide, tert-butyl hydroperoxide and pinane hydroperoxide, organic peroxides, organic sulphoxides, organic amines and amides, phosphines and phosphites, nitriles, triazoles such as benzotriazole, diaziridines and oximes.

When the compositions of the invention contain inhibitors (G), the amounts are preferably from 0.01 to 20 parts by weight, more preferably from 0.01 to 10 parts by weight and most preferably from 0.05 to 2 parts by weight, all based on 100 parts by weight of ingredient (A). The compositions of the invention preferably do contain inhibitors (G).

The (H) plasticizers optionally employed may comprise any plasticizers known from the field of addition-crosslinking materials, examples being trialkylsilyl-terminated, linear or branched siloxanes or cyclic siloxanes free of aliphatically unsaturated moieties and of silicon-bonded hydrogen, of which linear and cyclic siloxanes are preferable.

The compositions of the invention preferably contain no plasticizer (H).

Examples of additives (K) are soluble dyes, organic and inorganic pigments, fluorescent dyes, fungicides, scents, dispersant auxiliaries, rheological additives, corrosion inhibitors, oxidation inhibitors, photoprotectants, thermal stabilizers, flame retardants, agents to influence the electrical properties and agents to improve thermal conductivity, light-scattering agents, of which inorganic pigments, organic pigments or fluorescent dyes are preferable.

When the compositions of the invention contain additives (K), the amounts involved are preferably from 0.1 to 30 parts by weight, more preferably from 1 to 20 parts by weight, and most preferably from 5 to 15 parts by weight, all based on 100 parts by weight of ingredient (A).

Examples of solvents (L) are aromatic solvents such as toluene, xylene, ethylbenzene or mixtures thereof and also organic esters of acetic acid such as ethyl acetate, butyl acetate, methoxypropyl acetate and hydrocarbons and/or mixtures thereof such as commercially available isoparaffin mixtures, of which aromatic solvents or isoparaffin mixtures are preferable.

When the compositions of the invention contain solvents (L), the amounts are preferably from 0.1 to 50 parts by weight, more preferably from 1 to 30 parts by weight and most preferably from 5 to 20 parts by weight, all based on 100 parts by weight of ingredient (A). The compositions of the invention preferably contain no solvents (L).

The compositions of the invention are preferably those containing
(A) siloxanes formed of units of formula (I),
optionally (B) siloxanes formed of units of formula (VI),
(C) siloxanes formed of units of formula (X),
(D) a catalyst to promote the addition of Si-bonded hydrogen onto aliphatic carbon-carbon multiple bonds,
optionally (E) fillers,
optionally (F) adhesion promoters, optionally (G) inhibitors,
optionally (H) plasticizers,
optionally (K) additives, and
optionally (L) solvents.

In a further preferred embodiment, the compositions of the invention preferably comprise those containing
(A) siloxanes formed of units of formula (I),
optionally (B) siloxanes formed of units of formula (VI),
(C) siloxanes formed of units of formula (X),
(D) a catalyst to promote the addition of Si-bonded hydrogen onto aliphatic carbon-carbon multiple bonds,
optionally (E) fillers,
(F) adhesion promoters,
optionally (G) inhibitors,
optionally (H) plasticizers,
optionally (K) additives, and
optionally (L) solvents.

The compositions of the invention more preferably comprise those containing
(A) siloxanes formed of units of formula (I),
(C) siloxanes formed of units of formula (X),
(D) a catalyst to promote the addition of Si-bonded hydrogen onto aliphatic carbon-carbon multiple bonds,
(F) adhesion promoters,
optionally (G) inhibitors,
optionally (H) plasticizers,
optionally (K) additives, and
optionally (L) solvents.

In a further preferred embodiment, the compositions of the invention comprise those containing
(A) siloxanes formed of units of formula (I),
(B) siloxane formed of units of formula (VI),
(C) siloxanes formed of units of formula (X),
(D) a catalyst to promote the addition of Si-bonded hydrogen onto aliphatic carbon-carbon multiple bonds,
(F) adhesion promoters,
optionally (G) inhibitors,
optionally (H) plasticizers,
optionally (K) additives, and
optionally (L) solvents.

In a further preferred embodiment, the compositions of the invention comprise those containing
(A) siloxanes formed of units of formula (I),
optionally (B) siloxanes formed of units of formula (VI),
(C) siloxanes formed of units of formula (X),
(D) a catalyst to promote the addition of Si-bonded hydrogen onto aliphatic carbon-carbon multiple bonds, which is selected from the group of platinum-vinylsiloxane complexes,
optionally (E) fillers,
(F) adhesion promoters,
optionally (G) inhibitors,
optionally (H) plasticizers,
optionally (K) additives, and
optionally (L) solvents.

In a further preferred embodiment, the compositions of the invention comprise those containing
(A) siloxanes formed of units of formula (I),
optionally (B) siloxanes formed of units of formula (VI), (C) siloxanes formed of units of formula (X),
(D) a catalyst to promote the addition of Si-bonded hydrogen onto aliphatic carbon-carbon multiple bonds, which is selected from the group consisting of cyclopentadienyltrimethylplatinum(IV) and its derivatives,
optionally (E) fillers,
(F) adhesion promoters,
optionally (G) inhibitors,
optionally (H) plasticizers,
optionally (K) additives, and
optionally (L) solvents.

Components (A) to (L) aside, the compositions of the invention preferably contain no further ingredients.

The components employed according to the invention may each comprise a mixture of at least two species of such a component as well as one species of a particular component.

The compositions according to the invention are preferably flowable, capable of being processed using commercially available metering equipment and colourless and transparent after vulcanization.

The compositions of the invention may—in a way which more particularly depends on the filler content and the viscosity of the ingredients—be of low viscosity and pourable, have a pasty consistency, be pulverulent or else constitute pliant high-viscosity materials, similarly to the compositions frequently referred to as RTV-1, RTV-2, LSR and HTV by those skilled in the art. Preferably, the compositions are of low viscosity and may conform to properties of compositions referred to as RTV-2 by those skilled in the art.

The compositions of the invention are obtainable in any conventional manner, for instance by methods and mixing processes of the type customary in the manufacture of addition-crosslinking compositions.

The present invention further provides a process for producing the compositions of the invention by mixing the individual components in any order.

This mixing together may be carried out at room temperature and the pressure of the ambient atmosphere, i.e. about 900 to 1100 hPa. If desired, however, this mixing together may also be carried out at higher temperatures, for example at temperatures in the range from 30 to 130° C. It is further possible to mix transiently or constantly under reduced pressure, for example at from 30 to 500 hPa absolute pressure, in order to remove volatile compounds and/or air.

When, in one embodiment, component (D) is a catalyst whereby the addition reaction is started with the aid of light, the mixing step of the invention is preferably carried out in the absence of light having a wavelength range of from 190 to 500 nm.

The process of the invention may be carried out in a continuous manner or batchwise.

In a preferred embodiment of the process according to the invention, catalyst (D) is uniformly mixed with a mixture of (A), optionally (B), (C), optionally (G) and optionally (F). The (D) catalyst employed according to the invention may be incorporated by itself, as a solution in a suitable solvent, or as a batch distributed uniformly with a small amount of a siloxane such as, for example, (C) or, if employed in certain embodiment, in component (B) or component (G).

The mixing apparatus used may be any suitable prior art apparatuses, for example dissolvers or planetary mixers.

The compositions of the invention may comprise not only one-component silicone compositions but also two-component silicone compositions. In the latter case, the component containing catalyst (D) is prepared by mixing catalyst (D) with (C) and optionally (B), optionally (G) and optionally (F) in a uniform manner, whereas the component containing the silicon-bonded hydrogen either consists of (A) only or is prepared by uniform mixing of component (A) with optionally (B), (C), optionally (G) and optionally (F).

When the compositions of the invention comprise one-component silicone compositions, the temperature of the compositions is preferably maintained at below 50° C., more preferably at from 10 to 30° C., during the mixing of the components in order to prevent a premature onset of the crosslinking reaction.

The materials of the invention which are crosslinkable by addition of Si-bonded hydrogen onto aliphatic multiple bonding may be crosslinked under the same conditions as the prior art compositions crosslinkable by hydrosilylation reaction.

The compositions of the invention are preferably processed using commercially available mixing and metering equipment, preferably at temperatures of between 15 and 50° C., preferably by metering into open moulds or directly onto the component parts desired, with subsequent crosslinking at the pressure of the ambient atmosphere, i.e. about 900 to 1100 hPa.

Crosslinking is preferably effected thermally.

More particularly, crosslinking is effected in the presence of a catalyst to promote the addition reaction upon activation by heating.

The crosslinking temperature is preferably in the range of from 0 to 200° C., in particular from 10 to 150° C. Crosslinking periods are preferably between 1 minute and 10 hours, more preferably between 10 minutes and 5 hours, most preferably between 30 minutes and 3 hours.

In another embodiment, crosslinking is effected at pressures of the type customary in an injection moulding machine, i.e. about 200,000 hPa. Temperatures in this embodiment are preferably between 50 and 200° C., in particular between 120 and 180° C. Crosslinking periods are between 1 second and 10 minutes, preferably between 5 seconds and 2 minutes.

In a further embodiment wherein the composition of the invention contains by way of component (D) a catalyst whereby the addition reaction is started with the aid of light, the composition is preferably crosslinked after irradiation in the UV-VIS range of the electromagnetic spectrum, i.e. between 190 and 800 nm, preferably between 250 and 500 nm. Useful sources of light include any known appropriate light sources and combinations of light sources with filters, for example mercury vapour lamps, doped mercury vapour lamps, xenon discharge lamps, other discharge lamps, LED light sources or lasers.

The present invention further provides shaped articles obtained by crosslinking the compositions of the invention.

The shaped articles of the invention may comprise any desired shaped articles, for example gaskets, press mouldings, extruded profiles, extruded strands, coatings, impregnations, encapsulation, lenses, articles for light conductance, prisms, polygonal structures, laminate layers or adhesive layers, preferably encapsulation, lenses and articles for light conductance.

The shaped articles of the invention have hardnesses which are preferably in the range from Shore A 20 to Shore D 80, more preferably in the range from Shore A 70 to Shore D 80. The shaped articles of the invention are preferably colourless and highly transparent with transmissions preferably >90% between 400 and 800 nm, measured by UV-VIS spectroscopy. The shaped articles of the invention preferably evince little, and more preferably, no yellowing under thermal stress. Shaped articles according to the invention have refractive indices $n_D^{25}$ of preferably >1.43, more preferably >1.46, yet more preferably >1.50, and most preferably >1.52.

The compositions of the invention and also the crosslinked products obtained therefrom according to the invention are useful for any purposes hitherto also utilizing elastomerically crosslinkable siloxane compositions and elastomers, respectively. This includes, for example, the silicone coating/impregnation of any desired substrates, the production of moulded parts, for example by injection moulding, extrusion, vacuum extrusion, cast moulding and compression moulding, and casts, use as sealants, and embedding and encapsulation compounds.

A preferred use of the composition of the invention is its use for encapsulation of optical semiconductor elements such as LEDs. In a preferred embodiment thereof, the composition of the invention is metered, for example with a customary metering rig, onto the semiconductor element and then vulcanized. Different chip designs can be used therein for the semiconductor elements (known as LED packages), such as SMD (surface mounted design) packages, COB (Chip on Board) packages, MCOB (Multiple Chip on Board) and others.

The compositions of the invention have the advantage of being easy to produce.

The compositions of the invention have the advantage of a very high stability in storage and a high rate of crosslinking.

The compositions of the invention further have the advantage of evincing an excellent profile of adherence.

The compositions of the invention further have the advantage of being easy to process.

The compositions of the invention have the advantage of being simple to vary while meeting the above-shown requirements.

The compositions of the invention further have the advantage of meeting the requirements for LED encapsulation compounds, having good processability and being curable into optically high-transparency vulcanizates.

The process for producing the siloxane compositions in the manner of the invention has the advantage of being simple to carry out.

Optical component parts such as LEDs encapsulated with the compositions of the invention before these were crosslinked surprisingly survive the alternating temperature test to, preferably, at least 100 cycles, more preferably at least 300 cycles, and most preferably at least 500 cycles.

Optical component parts such as LEDs encapsulated with the compositions of the invention before these were crosslinked advantageously have an improved resistance to sulphur-containing gases.

Optical component parts such as LEDs encapsulated with the compositions of the invention before these were crosslinked advantageously have improved light efficiencies over the prior art.

Unless otherwise stated, the examples hereinafter are carried out at a pressure of the ambient atmosphere, i.e. for example at 1000 hPa, and at room temperature, i.e. at about 23° C., and/or at a temperature as is established when the reactants are added together at room temperature without additional heating or cooling, and also at a relative humidity of about 50%. Parts and percentages unless otherwise stated are further all by weight.

Chemical entities are characterized in the present text by indication of data obtained using instrumental analysis. The underlying measurements are carried out either in accordance with publicly accessible standards or determined using specifically developed methods. To safeguard the clarity of the teaching disclosed, the methods used are here specified:

Viscosity:

Viscosities unless otherwise stated are determined on an MCR302 rheometer from Anton Paar, D-Ostfildern as per DIN EN ISO 3219 in rotation with a plate-cone system of measurement. The measurements are carried out in the Newtonian domain of the samples. Where a sample exhibits non-Newtonian behaviour, the rate of shear is also reported. Unless otherwise indicated, all reported viscosities relate to 25° C. and standard pressure at 1013 mbar.

Refractive Index:

Refractive indices are determined in the wavelength range of visible light, unless otherwise stated at 589 nm and 25° C. ($n_D^{25}$) and standard pressure at 1013 mbar as per the standard DIN 51423. Abbe refractometers from A. Krüss Optronics, D-Hamburg and from Atago, Japan, type DR-M2 were used.

Molecular Compositions:

Molecular compositions are determined using nuclear magnetic resonance spectroscopy (regarding the terminology see ASTM E 386: High-Resolution Nuclear Magnetic Resonance (NMR) spectroscopy: terms and symbols), by measuring the $^1$H nucleus and the $^{29}$Si nucleus.

Description of 1H NMR Measurement

Solvent: $CDCl_3$, 99.8% d

Sample concentration: about 50 mg/1 ml $CDCl_3$ in 5 mm NMR vial

Measurement without admixture of TMS, spectral referencing of residual $CHCl_3$ in $CDCl_3$ at 7.24 ppm Spectrometer: Bruker Avance I 500 or Bruker Avance HD 500

Probe head: 5 mm BBO probe head or SMART probe head (from Bruker)

Measurement parameters:

Pulprog=zg30

TD=64 k

NS=64 or 128 (depending on the sensitivity of the probe head)

SW=20.6 ppm

AQ=3.17 s

D1=5 s

SFO1=500.13 MHz

O1=6.175 ppm

Processing parameters:

SI=32 k

WDW=EM

LB=0.3 Hz

Depending on the spectrometer type used, individual adjustments of the measurement parameters may be required.

Description of 29Si NMR Measurement

Solvent: $C_6D_6$ 99.8% d/$CCl_4$ 1:1 v/v with 1 wt % of $Cr(acac)_3$ as relaxation reagent Sample concentration: about 2 g/1.5 ml solvent in 10 mm NMR vial Spectrometer: Bruker Avance 300

Probe head: 10 mm 1H/13C/15N/29Si glass-free QNP probe head (from Bruker)

Measurement parameters:

Pulprog=zgig60

TD=64 k

NS=1024 (depending on probe head sensitivity)

SW=200 ppm

AQ=2.75 s

D1=4 s

SFO1=300.13 MHz

O1=−50 ppm

Processing parameter:

SI=64 k

WDW=EM

LB=0.3 Hz

Depending on the spectrometer type used, individual adjustments of the measurement parameters may be required.

Molecular Weight Distributions:

Molecular weight distributions are determined as Mw weight averages and Mn number averages, using the method of gel permeation chromatography (GPC or Size Exclusion Chromatography (SEC)) with polystyrene standard and refractive index (RI) detector. Unless otherwise noted, THF is used as mobile phase and DIN 55672-1 applies. Polydispersity is the Mw/Mn quotient.

Glass Transition Temperatures:

Glass transition temperature is determined by differential scanning calorimetry (DSC) to DIN 53765, in a perforated crucible at a heating rate of 10 K/min on a DSC 1 calorimeter from Mettler Toledo, CH-Greifensee.

Shore Hardnesses:

Shore hardnesses A and D are determined to DIN (German Industrial Specification) 53505 (as at August 2000) on hardness-measuring instruments from Bareiss, D-Oberdischingen (models HPE II Shore A and Shore D), respectively.

Alternating Temperature Test:

The alternating temperature tests on vulcanizates and/or operational encapsulated component parts are carried out using instruments from Espec, Japan (Thermal Shock Chamber TSE-11, Elevator Type). Unless otherwise stated, the thermocycles have a bottom temperature of −45° C. and a top temperature of 125° C. The samples are maintained at either temperature for 15 minutes. One cycle thus takes 30 minutes.

Resistance to Sulphur-Containing Gases:

The water-covered base of a glass vessel has a dish containing $K_2S$ placed onto it such that the $K_2S$ does not come into contact with the water. The operational component parts (LEDs for example) are placed in the gas space above the dish containing $K_2S$ and the vessel is sealed. The glass vessel is heated to 85° C. in a water bath. Measurements on the component parts are typically carried out at intervals of 8 h. The procedure for the measurements is as follows: first the light efficiency of the untreated LEDs is measured. Then, the LEDs are exposed as described above to the conditions in the above-described glass vessel containing $K_2S$. Thereafter, the light efficiency of the LEDs is measured again and compared with the initial value. This may then be followed by further cycles of exposure in the glass vessel and subsequent measurement of the light efficiency.

Light Efficiency:

The light efficiencies are determined using an instrument from Instrument Systems, Japan, of the type Compact Array Spectrometer CAS 140CT on an Ulbricht sphere of type ISP 250 (250 mm internal diameter) in accordance with CIE 127 for radiant power measurements on LEDs.

Hereinafter

Ph is phenyl=$C_6H_5$—,

Vi is vinyl=$CH_2$=CH—, and

Me is methyl=$CH_3$—.

Preparing an Si—H and Si-Vi Bifunctional Phenyl-Type Resin of Balanced Functionality (A1)

The apparatus used for carrying out the reaction is a 1 l 4-neck glass flask equipped with an outlet, a KPG stirrer, an intensive condenser and a metering vessel (dropping funnel). A 300 g quantity of completely ion-free water is introduced into the glass flask. A magnetic stirrer is used to mix 60 g (0.5 mol) of vinyldimethylchlorosilane (molecular weight 120.5 g/mol), 135 g (0.63 mol) of phenyltrichlorosilane (molecular weight 211.5 g/mol) and 30 g (0.31 mol) of dimethylchlorosilane (molecular weight 94 g/mol) in a 1 l glass beaker and then the mixture is transferred into the metering vessel.

The chlorosilane mixture is metered into the initial water charge over 2 hours, during which the temperature rises from 21.3° C. to 46.0° C. On completion of the metered addition, the mixture is subsequently stirred for 1 hour longer without heating or cooling. Thereafter, a further 19 g (0.2 mol) of dimethylchlorosilane are introduced into the metering vessel and admixed over a period of 10 minutes. On completion of the metered addition the temperatures is 32° C. The mixture is subsequently stirred for 20 minutes. A two-phase reaction mixture is obtained. The bottom phase is the aqueous phase, which is acidic due to hydrochloric acid and is discharged from the flask. A 500 g quantity of completely ion-free water is added to the remaining product phase before heating to 60° C. In the two-phase mixture obtained, the top phase is the aqueous phase, which is again separated off. The washing procedure is repeated altogether three times. Then, 15 g of Seitz EF filter aid are admixed to the product phase, before stirring for 15 minutes and filtration with a pressure filter apparatus through a Seitz K 100 filter plate.

The filtrate is heated for 2 hours in a rotary evaporator at 160° C. and 10 mbar pressure to obtain 110 g of a slightly cloudy product having a viscosity of 133 mm²/s.

The resulting resin (A1) is shown by SEC (mobile phase THF) to have a molecular weight of Mw=1900 g/mol and Mn=1000 g/mol. The silanol content is determined by $^1$H NMR as 195 ppm.

The vinyl content is 2.64 mmol/g, and the Si-bonded hydrogen content is 2.54 mmol/g.

According to $^{29}$Si NMR, the molar composition is:
ViMe$_2$SiO$_{1/2}$: 27.4%,
Me$_2$(H)SiO$_{1/2}$: 26.3%,
Me$_2$SiO$_{2/2}$: 1.2%,
Ph(OH)$_2$SiO$_{1/2}$: 0.0%,
Ph(OH) SiO$_{2/2}$: 8.3% and
PhSiO$_{3/2}$: 36.8%.

The product is free of alkoxysilyl groups.

Preparing an Si—H and Si-Vinyl Bifunctional Phenyl-Type Resin where SiH/Vi=1.15 (A2)

The procedure is similar as for the preparation of resin (A1).

The apparatus used is a 4 l flask. The amounts used are chosen as follows:
completely ion-free water: 1350 g
vinyldimethylchlorosilane (molecular weight 120.5 g/mol): 188.9 g (1.57 mol)
phenyltrichlorosilane (molecular weight 211.5 g/mol): 674.85 g (3.19 mol)
dimethylchlorosilane in the chlorosilane mixture: 115.48 g (1.23 mol)
dimethylchlorosilane for later dosage: 73.22 g (0.78 mol).

The washings are done at 45° C. The product is devolatilized in a rotary evaporator at 100° C. and 6 mbar to obtain 470 g of a clear product having a viscosity of 548 mPas and a refractive index n$_D^{25}$ of 1.502.

The resulting resin (A2) is shown by SEC (mobile phase THF) to have a molecular weight of Mw=1700 g/mol and Mn=1100 g/mol. The silanol content is determined by $^1$H NMR as 394 ppm.

The vinyl content is 2.15 mmol/g, and the Si-bonded hydrogen content is 2.52 mmol/g.

According to $^{29}$Si NMR, the molar composition is:
ViMe$_2$SiO$_{1/2}$: 23.0%,
Me$_2$(H)SiO$_{1/2}$: 27.2%,
Ph(OH)SiO$_{2/2}$: 9.8% and
PhSiO$_{3/2}$: 40.0%.

The product is free of alkoxysilyl groups.

Preparing an Si—H and Si-Vinyl Bifunctional Phenyl-Type Resin where SiH/Vi=2.3 (A3)

The procedure is similar as for the preparation of resin (A1). The apparatus used is a 4 l flask. The amounts used are chosen as follows:
completely ion-free water: 1320 g
vinyldimethylchlorosilane: 107.38 g (0.89 mol)
phenyltrichlorosilane (molecular weight 211.5 g/mol): 674.85 g (3.19 mol)
dimethylchlorosilane in the chlorosilane mixture: 156.63 g (1.65 mol)
dimethylchlorosilane for later dosage: 96.00 g (1.01 mol).

The washings are done at 45° C. The product is devolatilized in a rotary evaporator at 100° C. and 6 mbar to obtain 413 g of a clear product having a viscosity of 861 mPas and a refractive index n$_D^{25}$ of 1.504.

The resulting resin (A3) is shown by SEC (mobile phase THF) to have a molecular weight of Mw=2000 g/mol and Mn=1200 g/mol. The silanol content is determined by $^1$H NMR as 680 ppm.

The vinyl content is 1.3 mmol/g, and the Si-bonded hydrogen content is 3.18 mmol/g.

According to $^{29}$Si NMR, the molar composition is:
ViMe$_2$SiO$_{1/2}$: 14.4%,
Me$_2$(H)SiO$_{1/2}$: 34.1%,
Ph (OH) SiO$_{2/2}$: 10.2% and
PhSiO$_{3/2}$: 41.3%.

The product is free of alkoxysilyl groups.

Preparing an Si—H and Si-Vinyl Bifunctional Phenyl-Type Resin where SiH/Vi=0.15 (A4)

The procedure is similar as for the preparation of resin (A1).

The apparatus used is a 1 l flask. The amounts used are chosen as follows:
completely ion-free water: 255 g
vinyldimethylchlorosilane: 60.00 g (0.497 mol)
phenyltrichlorosilane: 135.36 g (0.64 mol)
dimethylchlorosilane in the chlorosilane mixture: 5.23 g (0.055 mol).

The washings are done at 45° C. The product is devolatilized in a rotary evaporator at 100° C. and 6 mbar to obtain 84 g of a clear product having a viscosity of 1390 mPas and a refractive index n$_D^{25}$ of 1.511.

The resulting resin (A4) is shown by SEC (mobile phase THF) to have a molecular weight of Mw=1900 g/mol and Mn=1200 g/mol. The silanol content is determined by $^1$H NMR as 3373 ppm.

The vinyl content is 3.33 mmol/g, and the Si-bonded hydrogen content is 0.46 mmol/g.

According to $^{29}$Si NMR, the molar composition is:
ViMe$_2$SiO$_{1/2}$: 38.6%,
Me$_2$(H) SiO$_{1/2}$: 5.8%,
Ph(OH)SiO$_{2/2}$: 20.2% and
PhSiO$_{3/2}$: 35.4%.

The product is free of alkoxysilyl groups.

Preparing an Si—H and Si-Vinyl Bifunctional Phenyl-Type Resin where SiH/Vi=6.65 (A5)

The procedure is similar as for the preparation of resin (A1).

The amounts used are chosen as follows:
completely ion-free water: 260 g
vinyldimethylchlorosilane: 6.87 g (0.057 mol)
phenyltrichlorosilane: 135.36 g (0.64 mol)

dimethylchlorosilane in the chlorosilane mixture: 48.52 g (0.513 mol).

The washings are done at 45° C. The product is devolatilized in a rotary evaporator at 100° C. and 6 mbar to obtain 74 g of a clear product having a viscosity of 611 mPas and a refractive index $n_D^{25}$ of 1.506.

The resulting resin (A5) is shown by SEC (mobile phase THF) to have a molecular weight of Mw=1600 g/mol and Mn=1100 g/mol. The silanol content is determined by $^1$H NMR as 1262 ppm.

The vinyl content is 0.47 mmol/g, and the Si-bonded hydrogen content is 3.97 mmol/g.

According to $^{29}$Si NMR, the molar composition is:
ViMe$_2$SiO$_{1/2}$: 6.0%,
Me$_2$(H)SiO$_{1/2}$: 40.7%,
Ph(OH)SiO$_{2/2}$: 14.9% and
PhSiO$_{3/2}$: 38.4%.

The product is free of alkoxysilyl groups.

Preparing an Si—H and Si-Vinyl Bifunctional Phenyl-Type Resin where SiH/Vi=2.10 (A6)

The procedure is similar as for the preparation of resin (A1).
The amounts used are chosen as follows:
completely ion-free water: 270.00 g
vinyldimethylchlorosilane: 18.89 g (0.157 mol)
phenyltrichlorosilane: 134.97 g (0.638 mol)
silane PM2: 26.73 g (0.156 mol)
dimethylchlorosilane in the chlorosilane mixture: 23.10 g (0.24 mol)
dimethylchlorosilane for later dosage: 14.64 g (0.15 mol).

The washings are done at 45° C. The product is devolatilized in a rotary evaporator at 100° C. and 6 mbar to obtain 89 g of a clear product having a viscosity of 314 mPas and a refractive index $n_D^{25}$ of 1.512.

The resulting resin (A6) is shown by SEC (mobile phase THF) to have a molecular weight of Mw=1700 g/mol and Mn=1000 g/mol. The silanol content is determined by $^1$H NMR as 474 ppm.

The vinyl content is 1.00 mmol/g, and the Si-bonded hydrogen content is 2.48 mmol/g.

According to $^{29}$Si NMR, the molar composition is:
ViMe$_2$SiO$_{1/2}$: 12.2%,
Me$_2$(H)SiO$_{1/2}$: 27.1%,
Me$_2$PhSiO$_{1/2}$: 11.6%,
Ph(OH)SiO$_{2/2}$: 11.9% and
PhSiO$_{3/2}$: 37.2%.

The product is free of alkoxysilyl groups.

Preparing an Si-Vinyl Functional Phenyl-Type Resin (C$_1$)

700 g of phenyltriethoxysilane (2.91 mol), 61.6 g of dimethyldiethoxysilane (0.415 mol) and 77.6 g of 1,3-divinyl-1,1,3,3-tetramethyldisiloxane (0.416 mol) are mixed homogeneously in a 2 l flask. To the mixture is added, under agitation, 550 g of water followed by 3.0 g of 20% HCl. The mixture is heated and refluxed for 2 h under agitation. After cooling, 4.5 g of 20% aqueous sodium hydroxide solution are admixed before refluxing for 30 min. At a pressure of 50 mbar, ethanol formed is distilled off and 800 ml of toluene are admixed. The aqueous phase is separated off and the organic phase is washed three times with 500 ml of water. The organic phase is dried over magnesium sulphate and the product is devolatilized in a rotary evaporator at 140° C. and 5 mbar to obtain 470 g of a clear, very highly viscous product having a glass transition temperature of 5° C.

The resulting resin (C1) is shown by SEC (mobile phase THF) to have a molecular weight of Mw=2000 g/mol and Mn=1400 g/mol. The vinyl content is 1.48 mmol/g.

According to $^{29}$Si NMR, the molar composition is:
ViMe$_2$SiO$_{1/2}$: 17.9%,
Me$_2$SiO$_{2/2}$: 11.0%
Ph(OR)SiO$_{2/2}$: 18.0% (R=H: 3%; R=ethyl: 15%) and
PhSiO$_{3/2}$: 53.1%.

Preparing an Si-Vinyl Functional Phenyl-Type Resin (C2)

600 g of phenyltrichlorosilane (2.84 mol) and 113 g (0.936 mol) of vinyldimethylchlorosilane are mixed homogeneously and added dropwise at 50° C. to a mixture of 600 g of water, 310 g of toluene and 190 g of ethyl acetate. The mixture is subsequently refluxed for two hours. After cooling the mixture down to room temperature, 700 ml of toluene are admixed, the aqueous phase is separated off and the organic phase is washed twice with 1 l of water and then dried over magnesium sulphate and the solvent is distilled off.

This gives 450 g of a clear, very highly viscous product having a glass transition temperature of 10° C.

The resulting resin (C2) is shown by SEC (mobile phase THF) to have a molecular weight of Mw=2200 g/mol and Mn=1600 g/mol.

The vinyl content is 1.85 mmol/g.

According to $^{29}$Si NMR, the molar composition is:
ViMe$_2$SiO$_{1/2}$: 31.2%,
Ph(OR)SiO$_{2/2}$: 30.2% (R=H: 5%; R=ethyl 25%) and
PhSiO$_{3/2}$: 38.6%.

Preparing an Si-Vinyl Functional Phenyl-Type Resin (C3)

A 2 l flask is charged with 700 g of phenyltriethoxysilane (2.91 mol), 217.6 g (1.6 mol based on PhMeSiO$_{1/2}$ units) of a short-chain α,ω-silanol-functional phenylmethyl oil having the average composition: (HO)PhMeSiO—[PhMeSiO]$_4$-PhMeSi—OH, which has an average molecular weight of Mw=800 g/mol at Mn=700 g/mol and a viscosity of 503 mPas at 25° C. and standard pressure at 1013 mbar, and 77.6 g of 1,3-divinyl-1,1,3,3-tetramethyldisiloxane (0.416 mol) are mixed homogeneously. To the mixture is added, under agitation, 550 g of water followed by 3.0 g of 20% HCl. The mixture is heated and refluxed for 2 h under agitation. After cooling, 4.5 g of 20% aqueous sodium hydroxide solution are admixed before refluxing for 30 min. At a pressure of 50 mbar, ethanol formed is distilled off and 800 ml of toluene are admixed. The aqueous phase is separated off and the organic phase is washed three times with 500 ml of water. The organic phase is dried over magnesium sulphate and the product is devolatilized in a rotary evaporator at 140° C. and 5 mbar to obtain 595 g of a clear, very highly viscous product.

The resulting resin (C3) is shown by SEC (mobile phase THF) to have a molecular weight of Mw=2300 g/mol and Mn=1500 g/mol. The vinyl content is 1.1 mmol/g.

According to $^{29}$Si NMR, the molar composition is:
ViMe$_2$SiO$_{1/2}$: 15.2%,
Me$_2$SiO$_{2/2}$: 30.9%
Ph(OR)SiO$_{2/2}$: 13% (R=H: 4%; R=ethyl: 9%) and
PhSiO$_{3/2}$: 40.9%.

EXAMPLES

The formulations are prepared as follows in the examples which follow:

The formulations are prepared by preparing homogeneous mixtures of the particular reported components using a DAC 150 FV type Speedmixer from Hauschild and subsequent degassing of the sample with an oil diffusion pump or on a planetary mixer from Thinky Corporation, Japan, type AWATORI RENTARO Model ARV-310 by simultaneous evacuation.

Unless otherwise stated, the degassed mixtures are poured into open steel moulds having a diameter of 35 mm and a height of 6 mm and allowed to vulcanize at 150° C. in a circulating air drying cabinet. The vulcanization period is reported with the particular formulation.

Example 1

In a planetary mixer, 80 parts of resin (A2) are mixed with 20 parts of resin (C1) and 0.0002 part (based on platinum) of a platinum-1,3-divinyl-1,1,3,3-tetramethyldisiloxane complex. The mixture is vulcanized at 150° C. for 1 h. The vulcanizate has a Shore D hardness of 58.

Example 2

In a planetary mixer, 45 parts of resin (A3) are mixed with 55 parts of resin (C1) and 0.0002 part (based on platinum) of a platinum-1,3-divinyl-1,1,3,3-tetramethyldisiloxane complex. The mixture is vulcanized at 150° C. for 1 h. The vulcanizate has a Shore D hardness of 65.

Example 3

In a planetary mixer, 35 parts of resin (A5) are mixed with 65 parts of resin (C1) and 0.0002 part (based on platinum) of a platinum-1,3-divinyl-1,1,3,3-tetramethyldisiloxane complex. The mixture is vulcanized at 150° C. for 1 h. The vulcanizate has a Shore D hardness of 70.

Example 4

In a planetary mixer, 60 parts of resin (A2) are mixed with 40 parts of resin (C1) and 0.0002 part (based on platinum) of a platinum-1,3-divinyl-1,1,3,3-tetramethyldisiloxane complex. The mixture is vulcanized at 150° C. for 1 h. The vulcanizate has a Shore D hardness of 30.

Example 5

In a planetary mixer, 70 parts of resin (A2) are mixed with 30 parts of resin (C3) and 0.0002 part (based on platinum) of a platinum-1,3-divinyl-1,1,3,3-tetramethyldisiloxane complex. The mixture is vulcanized at 150° C. for 1 h. The vulcanizate has a Shore D hardness of 45.

Example 6

In a planetary mixer, 60 parts of resin (A2) are mixed with 30 parts of resin (C1), 10 parts of a vinyl-terminated polydimethylphenylmethylsiloxane having the composition $(Me_2ViSiO_{1/2})_2(MePhSiO_{2/2})_{60}(Me_2SiO_{2/2})_{12}$ (refractive index $n_D^{25}=1.538$, viscosity $\eta=7800$ mPas) and 0.0002 part (based on platinum) of a platinum-1,3-divinyl-1,1,3,3-tetramethyldisiloxane complex. The mixture is vulcanized at 150° C. for 1 h. The vulcanizate has a Shore D hardness of 40.

Example 7

In a planetary mixer, 60 parts of resin (A2) are mixed with 40 parts of resin (C1) and 0.002 part (based on platinum) of methylcyclopentadienyltrimethylplatinum(IV). The mixture is degassed, poured into an open steel mould having a diameter of 35 mm and a height of 6 mm and irradiated with an iron irradiator ("D-bulb") from Hanle, Gräfelfing, Germany at 140 mW/cm² for 15 seconds. The vulcanizate has a Shore D hardness of 50.

Example 8

In a planetary mixer, 60 parts of resin (A2) are mixed with 30 parts of resin (C1), 10 parts of a vinyl-terminated polydimethylphenylmethylsiloxane having the composition $(Me_2ViSiO_{1/2})_2(MePhSiO_{2/2})_{60}(Me_2SiO_{2/2})_{12}$ (refractive index $n_D^{25}=1.538$, viscosity $\eta=7800$ mPas), 0.5 part of (3-glycidoxypropyl)trimethoxysilane and 0.0002 part (based on platinum) of a platinum-1,3-divinyl-1,1,3,3-tetramethyldisiloxane complex. The mixture is vulcanized at 150° C. for 1 h. The vulcanizate has a Shore D hardness of 40.

Comparative Example 1

In a planetary mixer, 70 parts of resin (C2) are mixed with 10 parts of a vinyl-terminated polydimethylphenylmethylsiloxane having the composition $(Me_2ViSiO_{1/2})_2(MePhSiO_{2/2})_{60}(Me_2SiO_{2/2})_{12}$ (refractive index $n_D^{25}=1.538$, viscosity $1=7800$ mPas), 20 parts of 1,1,5,5-tetramethyl-3,3-diphenyltrisiloxane and 0.0002 part (based on platinum) of a platinum-1,3-divinyl-1,1,3,3-tetramethyldisiloxane complex. The mixture is vulcanized at 150° C. for 2 h. The vulcanizate has a Shore A hardness of 60.

Comparative Example 2

In a planetary mixer, 65 parts of resin (C2) are mixed with 35 parts of 1,1,5,5-tetramethyl-3,3-diphenyltrisiloxane and 0.0002 part (based on platinum) of a platinum-1,3-divinyl-1,1,3,3-tetramethyldisiloxane complex. The mixture is vulcanized at 150° C. for 4 h. The vulcanizate has a Shore D hardness of 38.

Example 9

In a planetary mixer, 50 parts of resin (A2) are mixed with 50 parts of resin (C1), 0.5 part of (3-glycidoxypropyl)trimethoxysilane and 0.0002 part (based on platinum) of a platinum-1,3-divinyl-1,1,3,3-tetramethyldisiloxane complex. The mixture is vulcanized at 150° C. for 1 h. The vulcanizate has a Shore D hardness of 68.

The invention claimed is:
1. A compositions comprising:
(A) at least one organopolysiloxane comprising at least 3 units of the formula

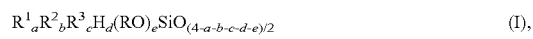
$$R^1_a R^2_b R^3_c H_d(RO)_e SiO_{(4-a-b-c-d-e)/2} \quad (I),$$

where
R¹ each independently are monovalent, SiC-bonded, optionally halogen- or cyano-substituted hydrocarbyl moieties with aliphatic carbon-carbon multiple bonding,
R² each independently are monovalent, SiC-bonded, optionally halogen- or cyano-substituted, saturated hydrocarbyl moieties,
R³ each independently are monovalent SiC-bonded aromatic moieties,
R each independently are hydrogen or monovalent, optionally substituted hydrocarbyl moieties which are optionally interrupted by heteroatoms,
a is 0, 1, 2 or 3,
b is 0, 1, 2 or 3,
c is 0, 1, 2 or 3, d is 0, 1 or 2, and e is 0, 1 or 2, with the proviso that the a+b+c+d+e sum is not more than 3, the sum total of Si-bonded hydrogen atoms and $R^1$ moieties per molecule is at least 3, the a+b+c+d sum is equal to 0 or 1 in at least 10 mol % of the units of formula (I), c is other than 0 in at least one unit, and the ratio of Si-bonded hydrogen atoms to Si-bonded $R^1$ moieties in the siloxane (A) is from 0.1 to 9, optionally (B) organopolysiloxanes comprising units of the formula

  (VI), where $R^4$ each independently are monovalent, SiC-bonded, optionally halogen- or cyano-substituted, hydrocarbyl moieties with aliphatic carbon-carbon multiple bonding, $R^5$ each independently are monovalent, SiC-bonded, optionally halogen- or cyano-substituted, saturated hydrocarbyl moieties, $R^6$ each independently are monovalent SiC-bonded aromatic moieties, $R^7$ each independently are hydrogen or monovalent, optionally substituted hydrocarbyl moieties, which are optionally interrupted by heteroatoms, f is 0, 1, 2 or 3, g is 0, 1, 2 or 3, h is 0, 1 or 2, i is 0 or 1, with the proviso that the f+g+h+i sum is not more than 3, siloxanes (B) have at least two $R^4$ moieties per molecule, the f+g+h+i sum is equal to 0 or 1 in not more than 20 mol % of the units of formula (VI) and h is other than 0 in at least one unit of formula (VI), (C) at least one organopolysiloxane comprising units of the formula $R^8_k R^9_l R^{10}_m (R^{11}O)_n SiO_{(4-k-l-m-n)/2}$  (X), where $R^8$ each independently are monovalent, SiC-bonded, optionally halogen- or cyano-substituted, hydrocarbyl moieties with aliphatic carbon-carbon multiple bonding, $R^9$ each independently are monovalent, SiC-bonded, optionally halogen- or cyano-substituted, saturated hydrocarbyl moieties, $R^{10}$ each independently are monovalent SiC-bonded aromatic moieties, $R^{11}$ each independently are hydrogen or monovalent, optionally substituted hydrocarbyl moieties, which are optionally interrupted by heteroatoms, k is 0, 1, 2 or 3, l is 0, 1, 2 or 3, m is 0, 1 or 2, and n is 0 or 1, with the proviso that the k+l+m+n sum is not more than 3, siloxanes (C) have at least two $R^8$ moieties per molecule, the k+l+m+n sum is equal to 0 or 1 in at least 10 mol % of the units of formula (X) and m is other than 0 in at least one unit of formula (X), and optionally, (D) a catalyst which promotes the addition of Si-bonded hydrogen onto aliphatic carbon-carbon multiple bonds.

2. The composition of claim 1, wherein siloxane(s) (A) comprise siloxanes having at least 3 units selected from the group consisting of the formulae $R^1_a R^2_b R^3_c H_d(RO)_e SiO_{1/2}$ where (a+b+c+d+e)=3  (II), $R^2_b R^3_c (RO)SiO_{2/2}$ where (b+c)=1  (IIIa), $R^2_b R^3_c SiO_{2/2}$ where (b+c)=2  (IIIb), $R^2_b R^3_c (RO)_e SiO_{3/2}$ where (b+c+e)=1  (IV), and $SiO_{4/2}$  (V), where R, $R^1$, $R^2$, $R^3$, a, b, c, d and e are each as defined above, with the proviso that not more than 25 mol % of the units in the siloxanes (A) are of formula (IIIb), the sum total of Si-bonded hydrogen atoms and $R^1$ moieties per molecule is at least 3, at least one $R^3$ moiety is present per molecule, and at least one unit of formula (IV) and/or (V) is present.

3. The composition of claim 1, wherein component (C) comprises siloxanes consisting of units selected from the group consisting of:

$R^8_k R^9_l R^{10}_m (R^{11}O)_n SiO_{1/2}$ where (k+l+m+n)=3  (XI), $R^9_l R^{10}_m (R^{11}O)SiO_{2/2}$ where (l+m)=1  (XIIa), $R^9_l R^{10}_m SiO_{2/2}$ where (l+m)=2  (XIIb), $R^9_l R^{10}_m (R^{11}O)_n SiO_{3/2}$ where (l+m+n)=1  (XIII), and $SiO_{4/2}$  (V)

where $R^8$, $R^9$, $R^{10}$, $R^{11}$, k, l, m and n are each as defined above, with the proviso that siloxanes (C) have at least two $R^8$ moieties per molecule, at least one $R^{10}$ moiety is present per molecule, and at least one unit of formula (XIII) and/or (V) is present.

4. The composition of claim 2, wherein component (C) comprises siloxanes consisting of units selected from the group consisting of:

$R^8_k R^9_l R^{10}_m (R^{11}O)_n SiO_{1/2}$ where (k+l+m+n)=3  (XI), $R^9_l R^{10}_m (R^{11}O)SiO_{2/2}$ where (l+m)=1  (XIIa), $R^9_l R^{10}_m SiO_{2/2}$ where (l+m)=2  (XIIb), $R^9_l R^{10}_m (R^{11}O)_n SiO_{3/2}$ where (l+m+n)=1  (XIII), and $SiO_{4/2}$  (V)

where $R^8$, $R^9$, $R^{10}$, $R^{11}$, k, l, m and n are each as defined above, with the proviso that siloxanes (C) have at least two $R^8$ moieties per molecule, at least one $R^{10}$ moiety is present per molecule, and at least one unit of formula (XIII) and/or (V) is present.

5. The composition of claim 1, comprising from 1 to 200 parts by weight of siloxane (C), based on 100 parts by weight of component (A).

6. The composition of claim 2, comprising from 1 to 200 parts by weight of siloxane (C), based on 100 parts by weight of component (A).

7. The composition of claim 3, comprising from 1 to 200 parts by weight of siloxane (C), based on 100 parts by weight of component (A).

8. The composition of claim 1, comprising:
(A) siloxanes comprising units of formula (I), optionally
 (B) siloxanes comprising units of formula (VI),
(C) siloxanes comprising units of formula (X),
(D) a catalyst which promotes the addition of Si-bonded hydrogen onto aliphatic carbon-carbon multiple bonds,
optionally (E) fillers,
optionally (F) adhesion promoters,
optionally (G) inhibitors,
optionally (H) plasticizers,
optionally (K) additives, and
optionally (L) solvents.

9. The composition of claim 1, comprising:
(A) siloxanes comprising units of formula (I),
optionally (B) siloxanes comprising units of formula (VI),
(C) siloxanes comprising units of formula (X),
(D) a catalyst which promotes the addition of Si-bonded hydrogen onto aliphatic carbon-carbon multiple bonds,
optionally (E) fillers,
(F) adhesion promoters,
optionally (G) inhibitors,
optionally (H) plasticizers,
optionally (K) additives, and
optionally (L) solvents.

10. A process for producing a composition of claim 1, comprising mixing the individual components in arbitrary order.

11. A shaped article obtained by crosslinking a composition of claim 1.

12. The shaped article of claim 11, which is a coating, encapsulation, or lens.

13. In a process for encapsulation of electrical or electronic components, the improvement comprising encapsulating with a composition of claim 1.

14. In a process for the manufacture of devices containing LEDs, the improvement comprising encapsulating at least one LED with a composition of claim 1.

* * * * *